United States Patent
Wong

[11] Patent Number: 6,057,226
[45] Date of Patent: May 2, 2000

[54] AIR GAP BASED LOW DIELECTRIC CONSTANT INTERCONNECT STRUCTURE AND METHOD OF MAKING SAME

[75] Inventor: Lawrence D. Wong, Beaverton, Oreg.

[73] Assignee: Intel Corporation, Santa Clara, Calif.

[21] Appl. No.: 08/978,106

[22] Filed: Nov. 25, 1997

[51] Int. Cl.[7] .................. H01L 21/764; H01L 21/312; H01L 21/31

[52] U.S. Cl. .................. 438/623; 427/99; 438/619; 438/622; 438/421; 438/422

[58] Field of Search .................. 438/421, 422, 438/619, 622, 623; 427/99

[56] References Cited

U.S. PATENT DOCUMENTS

| | | | |
|---|---|---|---|
| 5,789,320 | 8/1998 | Andricacos et al. | 438/678 |
| 5,792,706 | 8/1998 | Michael et al. | 438/626 |
| 5,814,555 | 9/1998 | Bandyopadhyay et al. | 438/619 |
| 5,888,591 | 3/1999 | Gleason et al. | 427/522 |

OTHER PUBLICATIONS

List, R. Scott, Abha Singh, Andrew Ralston, and Girish Dixit, "Integration of Low-k Dielectric Materials Into Sub–0.25–$\mu$m Interconnects", *MRS (Materials Research Society) Bulletin*, Oct. 1997, pp. 61–69.

*Primary Examiner*—Rabon Sergent
*Attorney, Agent, or Firm*—Raymond J. Werner

[57] ABSTRACT

An air bridge between closely spaced interconnect lines is formed by a high density plasma chemical vapor deposition of fluorinated amorphous carbon. In one particular embodiment of the present invention, to create the air bridge, high density plasma chemical vapor deposition of fluorocarbon and hydrocarbon precursors, with little or no rf bias applied to the substrate is performed. For mechanical support of subsequently formed layers, the air bridge is capped by a hard mask layer, typically formed from an insulating material such as silicon dioxide, fluorinated silicon dioxide, or silicon nitride.

17 Claims, 6 Drawing Sheets

AIR GAP BASED LOW DIELECTRIC CONSTANT INTERCONNECT STRUCTURE AND METHOD OF MAKING SAME

BACKGROUND OF THE INVENTION

1. Field of the Invention

The present invention relates generally to microelectronic structures and fabrication methods, and more particularly to the formation of interconnect insulation having low dielectric constants.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide.

A consequence of having of patterned conductive material separated by an insulating material, whether the conductive material is on a single level or multiple levels, is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk.

FIGS. 1(a)–(b) illustrate a conventional approach to providing an insulating material between interconnect lines. A layer of conductive material is deposited onto the surface of a substrate 102 and then patterned to provide interconnect lines 104, as shown in FIG. 1(b). An inter-layer dielectric 106 is then formed as shown in FIG. 1(b). Inter-layer dielectric 106 generally fills the space between and above interconnect lines 104. The parasitic capacitance seen by an interconnect line is a function of the distance to another conductor and the dielectric constant of the material therebetween.

One way to reduce the unwanted capacitance between the interconnects is to increase the distance between them. Increased spacing between interconnect has adverse consequences such as increased area requirements, and corresponding increases in manufacturing costs. Another way to reduce the unwanted capacitance between the interconnects is to use an insulating material with a lower dielectric constant.

What is needed is a structure providing low parasitic capacitance between patterned conductors, and methods of making such a structure.

SUMMARY OF THE INVENTION

Briefly, an air bridge between closely spaced interconnect lines is formed by a high density plasma chemical vapor deposition (HDP CVD) of fluorinated amorphous carbon.

In one particular embodiment of the present invention, to create the air bridge, HDP CVD of fluorocarbon and hydrocarbon precursors is performed, with little or no rf bias applied to the substrate. For mechanical support of subsequently formed layers, the air bridge is capped by a hard mask layer, typically formed from an insulating material such as silicon dioxide, fluorinated silicon dioxide, or silicon nitride.

DETAILED DESCRIPTION

Terminology

Figure 1A:
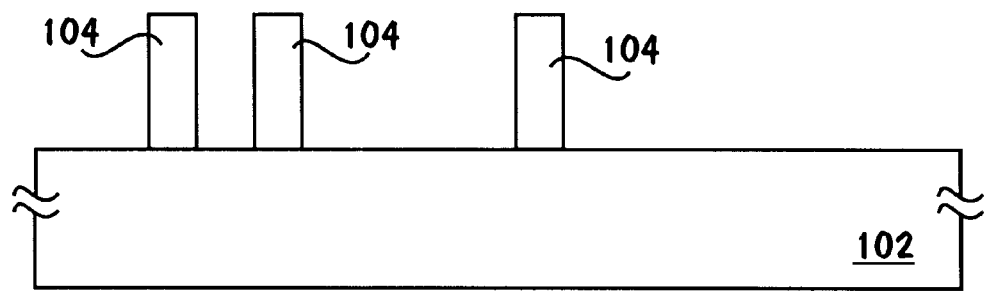
FIG. 1(a) is a schematic cross-section of interconnect lines formed on a substrate.
Figure 1B:
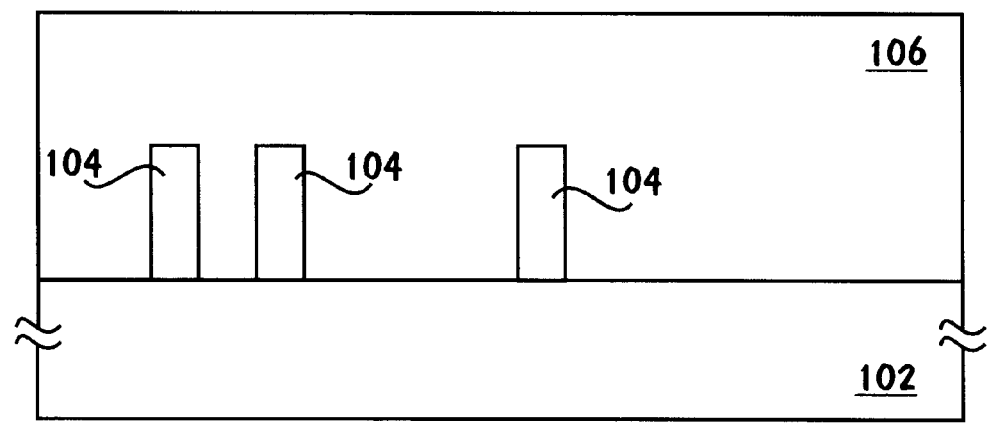
FIG. 1(b) is a schematic cross-section of interconnect lines after the formation, by deposition and planarization, of a conventional inter-layer dielectric.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than oxides of silicon.

The term vertical, as used herein, means substantially orthogonal to the surface of a substrate.

Overview

In order to manufacture integrated circuits with low parasitic capacitance between conductors, it is desirable to electrically isolate the conductors from each other with an insulator having a low dielectric constant. Organic polymers and silicon based insulators containing organic polymers have dielectric constants less than the dielectric constant of silicon dioxide, which is one of the most common insulators used in the manufacture of integrated circuits.

Air has a dielectric constant even lower than that of organic polymers. To reduce the dielectric constant of the insulator between interconnect lines, it is desirable to introduce air gaps between interconnect lines. However, in order to form additional layers above the air gap, it is necessary to essentially seal the air gap between interconnect lines. When viewed in cross-section, the sealing layer appears as a bridge between adjacent interconnect lines. Structures that include air gaps formed between interconnects in this way are often are referred to as air bridges.

In an embodiment of the present invention, an air bridge between closely spaced interconnect lines is formed by an HDP CVD of fluorinated amorphous carbon. In particular, to create the air bridge, HDP CVD of fluorocarbon and hydrocarbon precursors, with little or no rf bias applied to the substrate is performed. For mechanical support of subsequently formed layers, the air bridge is capped by a hard mask layer, typically formed from an insulating material such as silicon dioxide, fluorinated silicon dioxide, or silicon nitride.

Structure

Figure 2A:
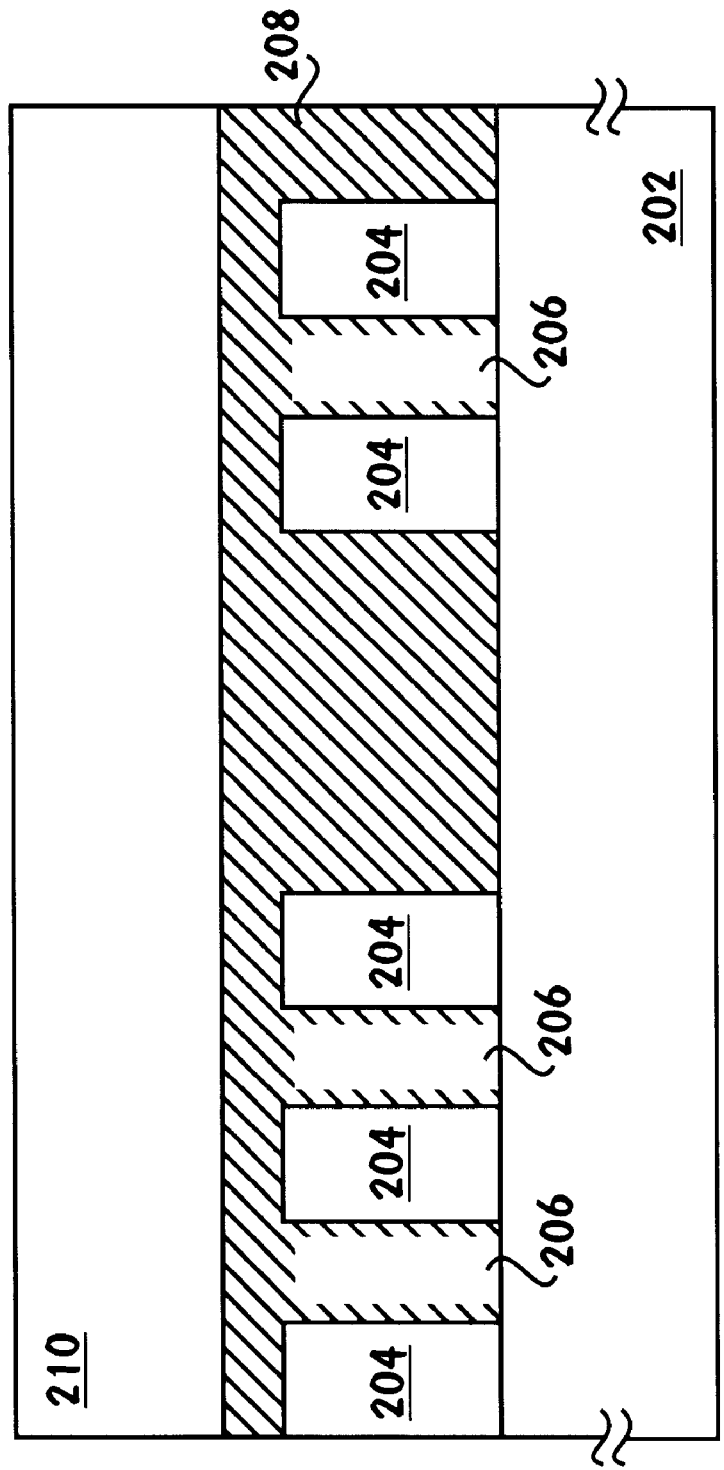
FIG. 2(a) is a schematic cross-section of interconnect lines and an inter-layer dielectric in accordance with a first embodiment of the present invention.

FIG. 2(a) shows a structure in accordance with an embodiment of the present invention. The structure has a substrate 202, and interconnect lines 204 formed thereon. Substrate 202 is generally, although not necessarily, a semiconductor wafer that has been processed through a number of steps before interconnect lines 204 are formed. Those skilled in the art having the benefit of this disclosure, will appreciate that these steps are typically in connection with the formation of transistors, diodes, and other interconnect levels, and that the exact nature of these previous processing steps is not material to the present invention.

A layer of fluorinated amorphous carbon 208 is superjacent the topsides of interconnect lines 204, and also fills the intra-layer region between widely spaced interconnect lines 204. Where interconnect lines 204 are closely spaced, an intra-layer region remains substantially free of fluorinated amorphous carbon. An air gap 206 thus formed by the absence of material is sealed, i.e., bridged by an overarching portion of fluorinated amorphous carbon layer 208 as shown in FIG. 2(a). An insulating layer 210 is formed over layer 208 to provide mechanical strength for subsequent processing.

Figure 2B:
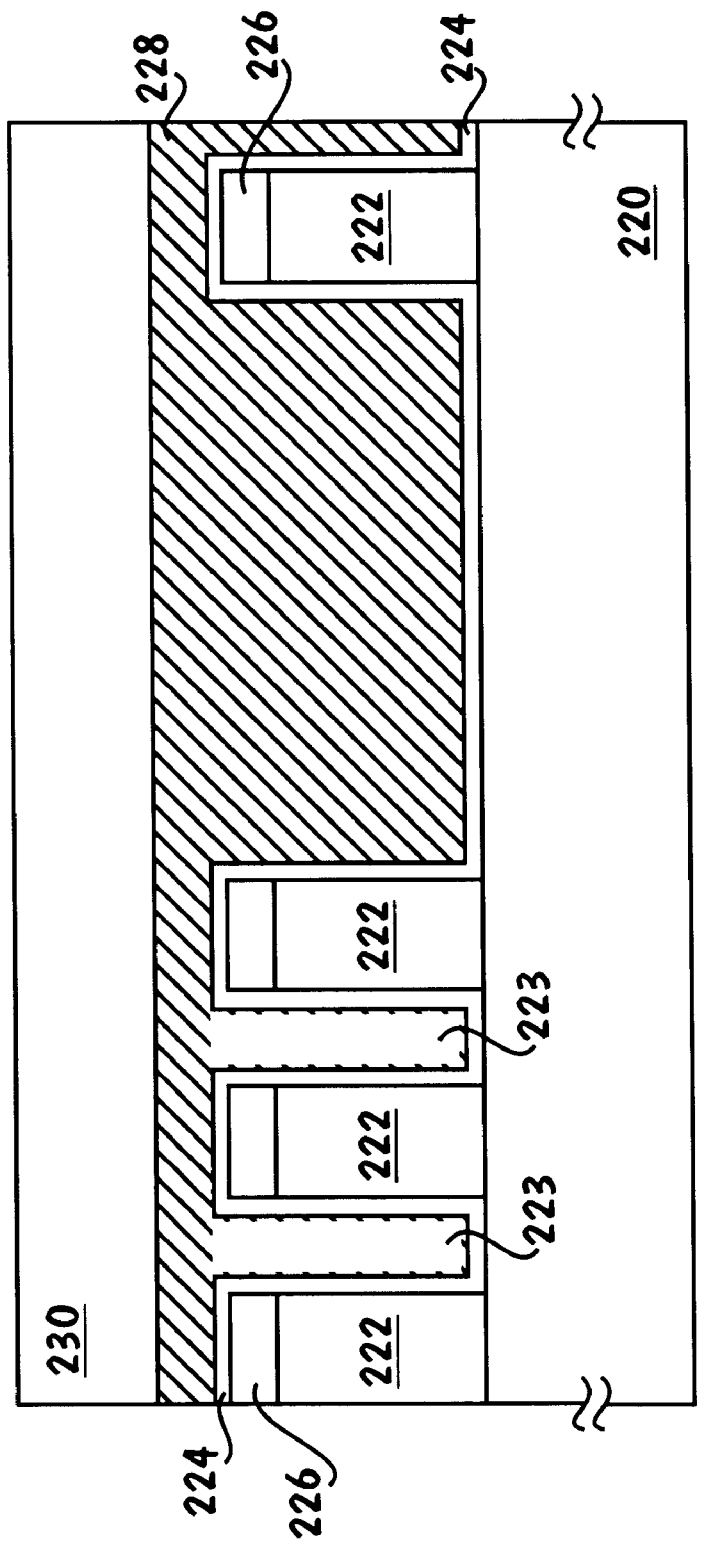
FIG. 2(b) is a schematic cross-section of interconnect lines and an inter-layer dielectric in accordance with a second embodiment of the present invention.

FIG. 2(b) shows a structure in accordance with an alternative embodiment of the present invention that includes a liner on the inner surfaces of the air gap, and a hardmask layer on the topside of the metal interconnect lines.

More particularly, the structure has a substrate 220, and interconnect lines 222 formed thereon. Interconnect lines 222 have a hardmask layer 226 covering the topsides thereof. Hardmask layer 226 is typically formed from an insulating material such as silicon dioxide, fluorinated silicon dioxide, or silicon nitride. Substrate 220 is generally, although not necessarily, a semiconductor wafer that has been processed through a number of steps before interconnect lines 222 are formed. Those skilled in the art having the benefit of this disclosure, will appreciate that these steps are typically in connection with the formation of transistors, diodes, and other interconnect levels, and that the exact nature of these previous processing steps is not material to the present invention. A liner 224 is superjacent hardmask layer 226, adjacent the vertical sidewalls of interconnect lines 222 and superjacent portions of substrate 220 not covered by interconnect lines 222.

A layer of fluorinated amorphous carbon 228 overlies the topsides of interconnect lines 222, and is superjacent that portion of liner 224 is superjacent the liner 224 in the area of the interconnect line topsides, as shown in FIG. 2(b). Layer 228 also fills the intra-layer region between widely spaced interconnect lines 222. Where interconnect lines 222 are closely spaced, an intra-layer region remains substantially free of fluorinated amorphous carbon. An air gap 223 thus formed by the absence of material is sealed, i.e., bridged by an overarching portion of layer 228 as shown in FIG. 2(b). An insulating layer 230 is disposed over layer 228. Layer 230 is typically an inorganic insulator such as an oxide of silicon, although other insulating materials of similar mechanical strength can be used instead.

Figure 2C:
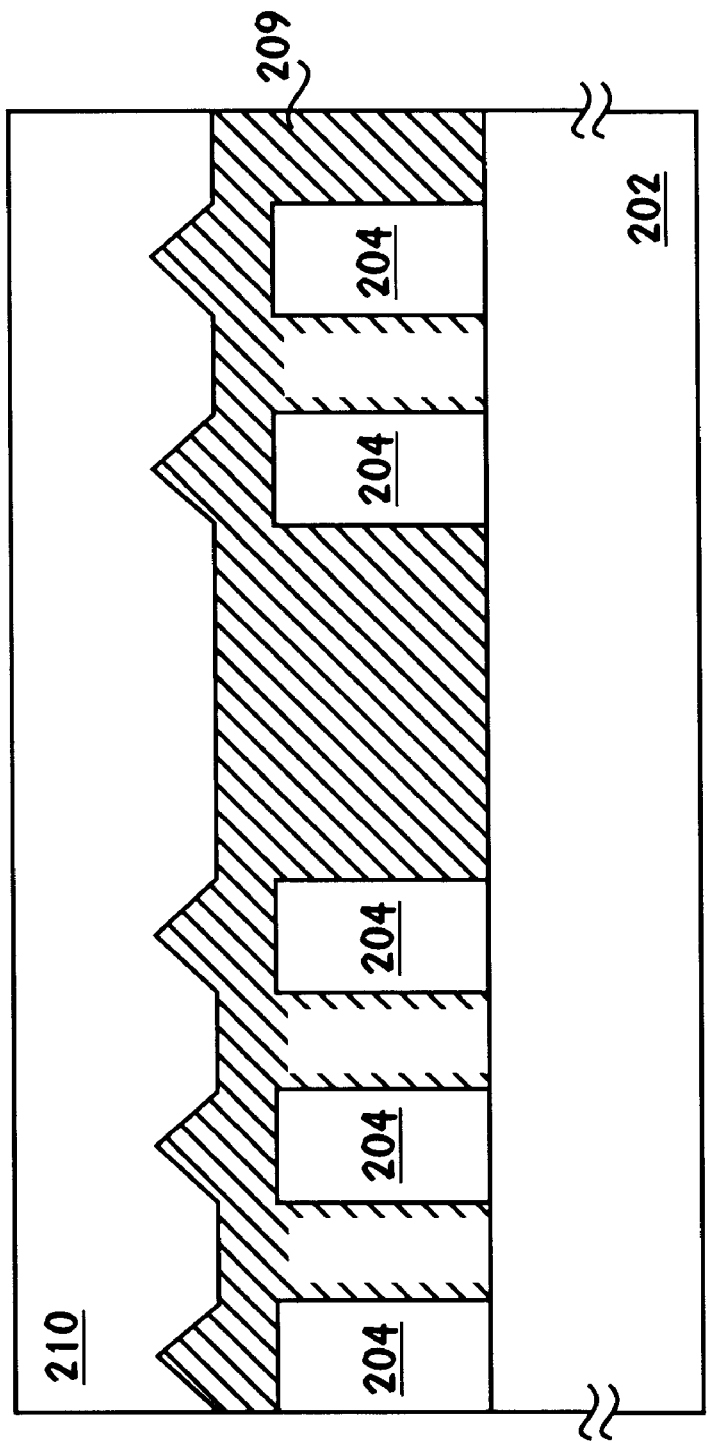
FIG. 2(c) is a schematic cross-section of interconnect lines and an inter-layer dielectric in accordance with a third embodiment of the present invention.

FIG. 2(c) shows a structure similar to that shown in FIG. 2(a). However, in this embodiment of the present invention, a fluorinated amorphous carbon layer 209 has non-planar regions of material build-up on the top surfaces of interconnect lines 204. An insulating layer 210 is formed over layer 209 to provide mechanical strength for subsequent processing. If insulating layer 210 is deposited as a conformal layer it will reflect the underlying topography of fluorinated amorphous carbon layer 209. As shown in FIG. 2(c), insulating layer 210 is planarized.

Method

A method of forming an inter-layer dielectric containing air bridges, in accordance with the present invention is described below in conjunction with FIGS. 3(a)–(b).

Figure 3A:
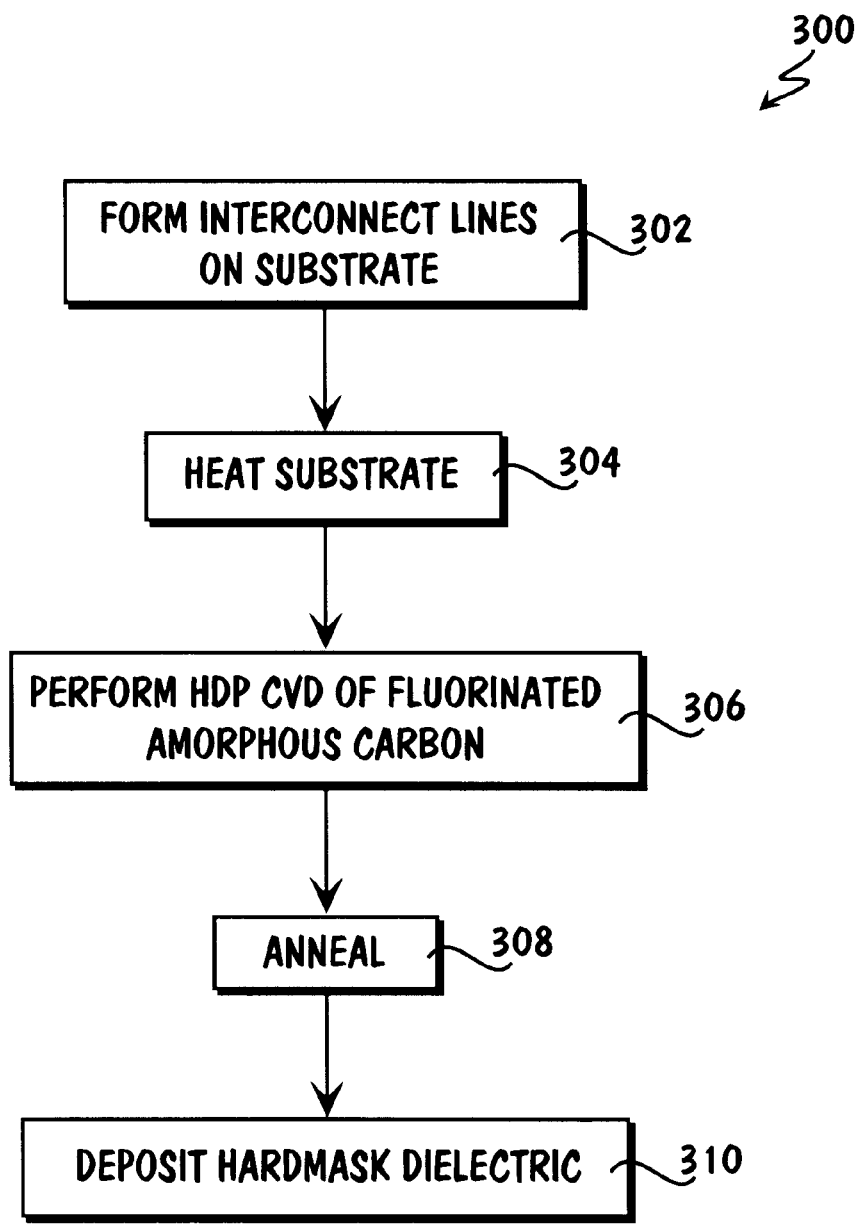
FIG. 3(a) is a flow diagram of a first illustrative process in accordance with the present invention.

Referring to FIG. 3(a), a process 300 of forming an inter-layer dielectric in accordance with the present invention is described. Interconnect lines are formed 302 by patterning a conductive layer that has been disposed upon a substrate, such as a silicon wafer. The conductive layer is formed from a metal such as aluminum, copper, silver, gold, or alloys of these metals. Those skilled in the art will recognize that various other conductive materials may also be used. Typically the wafer is then placed into a reaction chamber and heated 304 to temperature in the range of approximately 300 degrees C. to approximately 430 degrees C. A high density plasma chemical vapor deposition of fluorinated amorphous carbon 306 is then performed. In the illustrative embodiment of the present invention, a high density plasma is a plasma having a density of approximately $10^{14}$ ions per square centimeter. The conditions for the HDP CVD that result in the formation of air bridges between closely spaced interconnect lines are, an rf bias in the range of zero to approximately 1.5 kilowatts applied to the substrate, a microwave power in the range of approximately 2 kilowatts to approximately 5 kilowatts to create the plasma, and at least one fluorocarbon introduced into the reaction chamber between the plasma and the substrate.

When an rf bias greater than zero is applied to the substrate, the deposition rate of the fluorinated amorphous carbon layer is increased, however there is a tendency to produce non-planar material build-up on the top surfaces of the interconnect lines (as shown in FIG. 2(c)).

Subsequent to the formation of the fluorinated amorphous carbon an anneal is performed 308 in the range of approximately 400 degrees C. to approximately 425 degrees C. Those skilled in the art having the benefit of this disclosure will appreciate that specific choices of temperatures and times for the annealing will depend, to some extent, on the overall thermal budget for a particular semiconductor manufacturing process.

In this illustrative embodiment of the present invention, the interconnect lines are metal, typically aluminum or an aluminum alloy, that are approximately 1 micron thick and have of minimum width of approximately 0.5 micron. The minimum spacing of these metal lines is approximately 0.5 micron. Those skilled in the art having the benefit of this disclosure will appreciate that various combinations of height, width and spacing of interconnect lines are compatible with the formation of air bridges in accordance with the present invention. More particularly, formation of air gaps has been observed when the ratio of metal thickness to inter-metal spacing is approximately 0.8 or greater.

Where, in the illustrative embodiment of the present invention, the spacing between metal lines is substantially larger than 0.5 micron, a substantially complete filling of the intra-layer spacing by the fluorinated amorphous carbon takes place, rather than the formation of air bridges. However, a significant adverse effect upon the circuit performance of the integrated circuit is not observed, even though the effective dielectric constant of the filled intra-layer space is higher than that of an air bridge, because the spacing is greater and therefore the capacitance between the non-closely spaced metal lines is relatively small. In other words, the air bridges form between closely spaced metal lines, where they are needed most to reduce parasitic capacitance, and do not form between metal lines that are widely spaced apart.

Various fluorocarbon and hydrocarbon precursors can be used to form the fluorinated amorphous carbon layer in accordance with the present invention. The fluorocarbon is typically injected into the reaction chamber, as a gas, between the plasma and the substrate, and is generally selected from the group consisting of $C_4F_8$, $C_5F_8$, and $C_6F_6$. The hydrocarbon is typically injected into the reaction chamber, as a gas, between the plasma and the substrate, and is generally selected from the group consisting of $C_2H_2$, $C_2H_4$, and $C_2H_6$.

Subsequent to the anneal of a fluorinated amorphous carbon layer that includes air bridge structures between closely spaced interconnect lines, an insulating material having greater mechanical strength than the fluorinated amorphous carbon is deposited 310 over the fluorinated amorphous carbon layer. Such a layer is often referred to in the field as a hardmask layer, or hardmask dielectric, and is typically comprised of a material such as silicon dioxide, fluorinated silicon dioxide, or silicon nitride. A typical thickness for such a layer is in the range of approximately 50 nm to approximately 100 nm.

Figure 3B:
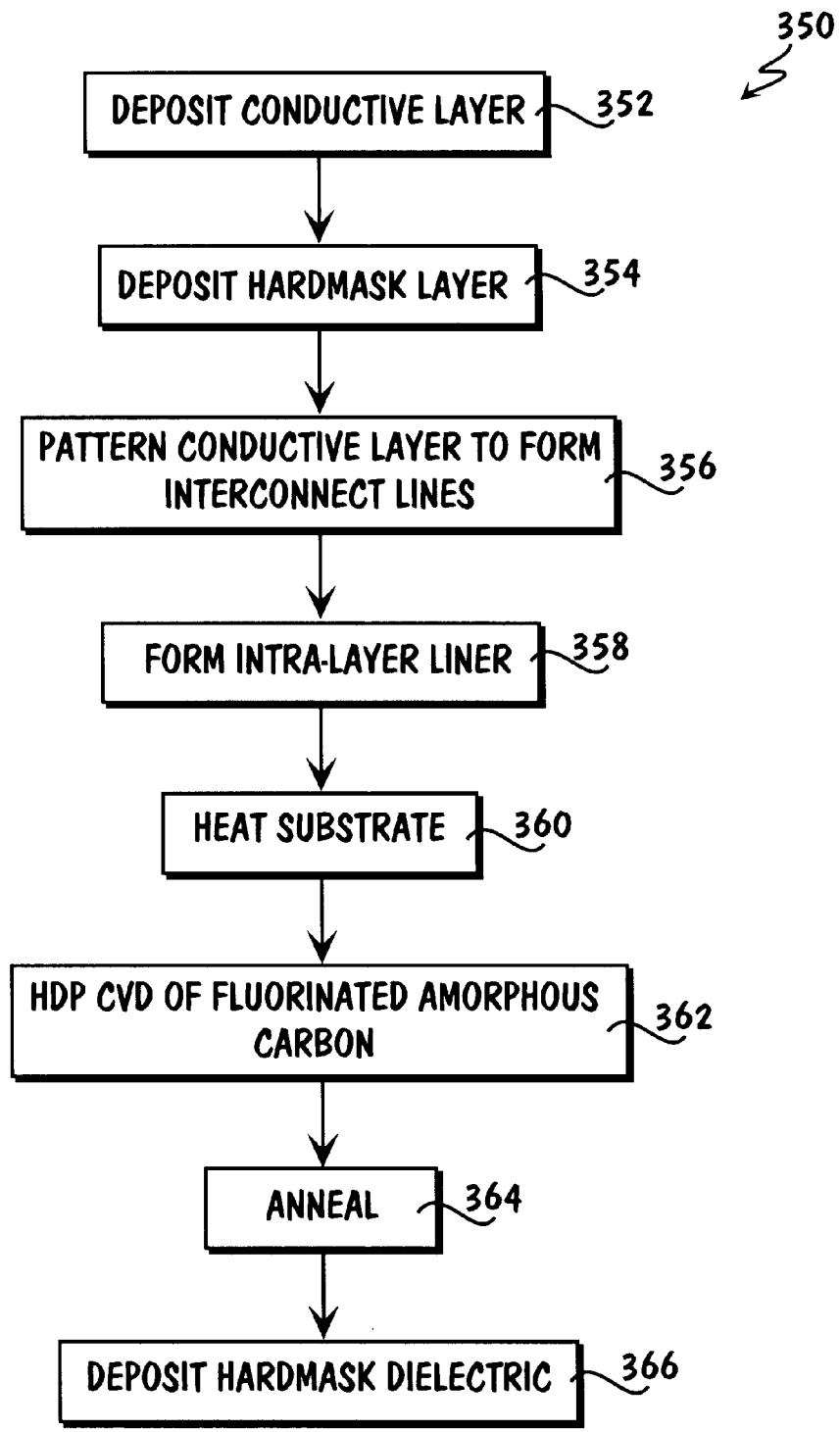
FIG. 3(b) is a flow diagram of a second illustrative process in accordance with the present invention.

Referring to FIG. 3(b), a process 350 of forming an inter-layer dielectric in accordance with the present invention is described. Process 350 is similar to process 300, described above, in terms of the formation of the fluorinated amorphous carbon layer having air bridges between closely spaced interconnect lines. Process 350 differs from process 300 in terms of having a silicon oxynitride hardmask layer covering the topside of the interconnect lines, and further differs in terms of having an oxide liner on the sidewalls of the interconnect lines and on that portion of the substrate not covered the interconnect lines.

More particularly, process 350 includes depositing a conductive layer 352 over a substrate. The substrate has a surface that is generally insulating, but can also have vias located therein. A hardmask layer is deposited 354 over the conductive layer. The hardmask layer can be a silicon oxynitride layer approximately 50 nm to approximately 100 nm thick. Well-known masking and etching methods are then used to pattern the hardmask and conductive layers so as to form conductive interconnect lines having topsides covered with the patterned oxynitride.

Subsequent to the formation of the interconnect lines, an intra-layer liner is formed 358. Intra-layer liner 358 is typically an oxide layer having a thickness in the range of approximately 10 nm to 100 nm, formed by chemical vapor deposition (CVD). Alternatively, intra-layer liner 358 can be formed by a plasma enhanced chemical vapor deposition (PECVD). The liner functions to support the structural stability of the interconnect lines.

Typically the substrate is then placed into a reaction chamber and heated 360 to temperature in the range of approximately 300 degrees C. to approximately 430 degrees C. A high density plasma chemical vapor deposition of fluorinated amorphous carbon 362 is then performed. In this illustrative embodiment of the present invention, a high density plasma is a plasma having a density of approximately 1014 ions per square centimeter. The conditions for the HDP CVD that result in the formation of air bridges between closely spaced interconnect lines are, an rf bias in the range of zero to approximately 1.5 kilowatts applied to the substrate, a microwave power in the range of approximately 2 kilowatts to approximately 5 kilowatts to create the plasma, and at least one fluorocarbon introduced into the reaction chamber between the plasma and the substrate.

After the formation of the fluorinated amorphous carbon an anneal is performed 364 in the range of approximately 400 degrees C. to approximately 425 degrees C. Those skilled in the art having the benefit of this disclosure will appreciate that specific choices of temperatures and times for the annealing will depend, to some extent, on the overall thermal budget for a particular semiconductor manufacturing process.

Subsequent to the anneal of a fluorinated amorphous carbon layer that includes air bridge structures between closely spaced interconnect lines, an insulating material having greater mechanical strength than the fluorinated amorphous carbon is deposited 366 over the fluorinated amorphous carbon layer. Such a layer is often referred to in the field as a hardmask layer, or hardmask dielectric, and is typically comprised of a material such as silicon dioxide, fluorinated silicon dioxide, or silicon nitride. This completes the low dielectric constant inter-layer dielectric of the present invention.

Typically, via openings are formed in the inter-layer dielectric, the via openings filled with a conductive material such as, for example, tungsten, and a conductive layer is then deposited and patterned. This process may be repeated to build multiple levels of interconnect. The fluorinated amorphous carbon layer having air bridge structures formed therein, in accordance with the methods of the present invention can be used as part of the inter-layer dielectric between a plurality of the various interconnect levels.

Conclusion

Embodiments of the present invention provide, low dielectric constant inter-layer insulators on integrated circuits.

An advantage of embodiments of the present invention is that parasitic capacitance between interconnect lines is reduced compared to conventional inter-layer insulation.

The present invention may be implemented with various changes and substitutions to the illustrated embodiments. For example, the present invention may be implemented on substrates comprised of materials other that silicon, such as, for example, gallium arsenide or sapphire. Additionally, illustrative embodiments describe vias between two levels of interconnect, however those skilled in the art will recognize that many interconnect levels may be formed in accordance with the present invention.

It will be readily understood by those skilled in the art that various other changes in the details, materials, and arrangements of the parts and steps which have been described and illustrated in order to explain the nature of this invention may be made without departing from the principles and scope of the invention as expressed in the subjoined claims.

What is claimed is:

1. A method of forming an inter-layer dielectric comprising:
    patterning a conductive layer having to form at least two interconnect lines on a substrate, the interconnect lines having a thickness and having a spacing therebetween; and forming a layer of fluorinated amorphous carbon, such that air bridges occur in the layer of fluorinated amorphous carbon between at least two interconnect lines wherein forming a layer of fluorinated amorphous carbon comprises placing the substrate having the patterned conductive layer thereon, in a reaction chamber; forming a high density plasma; injecting at least one precursor gas into the reaction chamber at a location between the high density plasma and the substrate; and providing an rf bias to the substrate in the range of zero to approximately 1.5 kilowatts and wherein the ratio of the thickness to the spacing is approximately 0.8 or greater.

2. The method of claim 1, wherein the high density plasma is formed from a gas selected from the group consisting of argon and helium.

3. The method of claim 1, wherein the high density plasma is formed from a microwave energy in the range of approximately 2 kilowatts to approximately 5 kilowatts.

4. The method of claim 1, wherein the substrate is heated to a temperature in the range of approximately 300 degrees C. to approximately 430 degrees C.

5. The method of claim 1, wherein the at least one precursor gas is selected from the group consisting of $C_4F_8$, $C_5F_8$, and $C_6F_6$.

6. The method of claim 1, wherein the at least one precursor gas comprises a fluorocarbon and a hydrocarbon.

7. The method of claim 6, wherein the hydrocarbon is selected from the group consisting Of $C_2H_2$, $C_2H_4$, and $C_2H_6$.

8. The method of claim 6, wherein the fluorocarbon is selected from the group consisting Of $C_4F_8$, $C_5F_8$, and $C_6F_6$.

9. The method of claim 1, further comprising, prior to patterning the conductive layer, depositing a hardmask material over the conductive layer.

10. The method of claim 9, wherein the hardmask material comprises silicon oxynitride.

11. The method of claim 1, further comprising, prior to forming a layer of fluorinated amorphous carbon, depositing a liner layer adjacent to sidewalls of the interconnect lines, and superjacent the substrate area not covered by the interconnect lines.

12. The method of claim 11, wherein the liner layer comprises an oxide of silicon.

13. The method of claim 11, wherein depositing the liner layer comprises performing a chemical vapor deposition.

14. The method of claim 1, wherein the conductive layer is a material selected from the group consisting of aluminum, copper, silver, and gold.

15. A method of forming an inter-layer dielectric, comprising:

a) forming a conductive layer on a substrate;

b) depositing a hardmask material so as to form a hardmask layer superjacent the conductive layer;

c) patterning the hardmask layer and conductive layer so as to form a plurality of interconnect lines, wherein the hardmask material remains superjacent to the interconnect lines and wherein the interconnect lines have a thickness and have a space therebetween;

d) depositing a liner layer adjacent vertical sidewalls of the interconnect lines and superjacent the substrate areas that are not covered by the interconnect lines; and e) performing a high density plasma chemical vapor deposition (HDP CVD) of fluorocarbon and hydrocarbon such that air bridges occur in a fluorinated amorphous carbon between at least two interconnect lines;

wherein an rf bias applied to the substrate during HDP CVD is limited to between zero and approximately 1.5 kilowatts and wherein a ratio of the thickness to the space is approximately 0.8 or greater.

16. The method of claim 15, wherein the fluorocarbon is selected from the group consisting Of $C_4F_8$, $C_5F_8$, and $C_6F_6$.

17. The method of claim 15, wherein the hydrocarbon is selected from the group consisting Of $C_2H_2$, $C_2H_4$, and $C_2H_6$.

* * * * *

UNITED STATES PATENT AND TRADEMARK OFFICE
CERTIFICATE OF CORRECTION

PATENT NO. : 6,057,226
DATED : May 2, 2000
INVENTOR(S) : Wong

It is certified that error appears in the above-identified patent and that said Letters Patent is hereby corrected as shown below:

In column 2, at line 39, delete "suicides" and insert --silicides--.

Signed and Sealed this

Twenty-second Day of May, 2001

Attest:

NICHOLAS P. GODICI

Attesting Officer     Acting Director of the United States Patent and Trademark Office